United States Patent
Kimppa et al.

(10) Patent No.: US 6,373,345 B1
(45) Date of Patent: Apr. 16, 2002

(54) MODULATOR STRUCTURE FOR A TRANSMITTER AND A MOBILE STATION

(75) Inventors: Harri Kimppa; Simo Murtojarvi, both of Salo; Markus Pettersson, Turku, all of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/429,911

(22) Filed: Oct. 29, 1999

(30) Foreign Application Priority Data

Oct. 30, 1998 (FI) ................................................ 982362

(51) Int. Cl.[7] ............................................... H03D 7/14
(52) U.S. Cl. ...................... 332/105; 455/323; 455/333; 455/118; 455/317; 455/313; 455/327; 455/359
(58) Field of Search ................................ 455/118, 317, 455/333, 326, 323, 313; 332/105; 327/359; 330/257, 260

(56) References Cited

U.S. PATENT DOCUMENTS

| | | | |
|---|---|---|---|
| 5,172,079 A | 12/1992 | Shigenari | 332/168 |
| 5,574,755 A | 11/1996 | Persico | 375/295 |
| 5,584,066 A | * 12/1996 | Okanobu | 455/302 |
| 5,847,623 A | 12/1998 | Hadjichristos | 332/105 |

FOREIGN PATENT DOCUMENTS

| | | |
|---|---|---|
| DE | 4425336 C1 | 9/1995 |
| DE | 197 08 007 A1 | 12/1998 |
| EP | 0 711 031 A1 | 8/1996 |
| EP | 0 767 536 A2 | 9/1997 |
| EP | 0903846 A2 | 3/1999 |
| GB | 2 261 130 A | 5/1993 |
| GB | 2 279 527 A | 4/1995 |
| WO | WO 96/08865 | 3/1996 |

OTHER PUBLICATIONS

European Search Report; Jul. 17, 2001; 3 pages.

* cited by examiner

Primary Examiner—Arnold Kinkead
(74) Attorney, Agent, or Firm—Perman & Green, LLP (57) ABSTRACT

A modulator having a high signal-to-noise ratio. The modulator comprises a switching arrangement and a driver arrangement coupled to the switching arrangement, said driver arrangement comprising driver components and among the driver components a low-pass filter arrangement. The modulator can be used, for example, in the transmitters of dual-band mobile stations without separate filters for each frequency band.

12 Claims, 7 Drawing Sheets

MODULATOR STRUCTURE FOR A TRANSMITTER AND A MOBILE STATION

The invention relates in general to modulators. In particular the invention relates to a modulator structure which is very suitable for dual-band or triple-band mobile stations.

BACKGROUND OF THE INVENTION

In modulation a carrier frequency is modified in a certain way so that the data to be transmitted using the radio signal is carried, for example, in the changes of the phase or amplitude of the carrier frequency. There are many modulation methods, which differ in the sense which properties of the carrier wave are modulated and how they are modulated. The arrangement that performs the modification of the carrier wave is called a modulator. There are also many types of modulators. A direct conversion modulator, for example, may be used in mobile stations. In a direct conversion modulator the modulation is performed directly in the carrier frequency; there is no intermediate frequency in the modulation process.

The most important characteristics of a modulator are the linearity and the signal-to-noise ratio S/N. The signal-to-noise ratio comprises the ratio of the transmit signal to the background noise at the transmit frequency range (TX), and the ratio of the transmit signal to the noise generated at the receive frequency range (RX). It is possible to enhance the signal-to-noise ratio at the RX frequency range by filtering the modulated signal using a suitable filter. The enhancement of the signal-to-noise ratio at the TX frequency range is not feasible after the modulator.

Usually filtering at the RX frequency range is done using a low pass filter, most preferably a duplex filter after the power amplification. Table 1 presents the signal-to-noise ratio limits for the receive frequency band defined for the GSM (Global System for Mobile Communications), PCN (Personal Communication Network) and PCS (Personal Communication System) networks.

In the table N 100 kHz defines the noise level generated by the transmitter chain in the reception at a frequency band with the width of 100 kHz. The noise is measured at a power level where the noise level is at a maximum. This power level is in practice the maximum transmit power. The measured noise power level is normalized from the 100 kHz width to a width of 1 Hz, whereby the level decreases by 50 dB and is in the column N 1 Hz. Thus the measurement is performed at a wide band-width, but it is normalized to a narrower band by calculation. There are also individual noise level differences between similar transmitters, and therefore there is a margin of 3 dBm, which is subtracted from the above mentioned level limits. $P_{out}$ is the output power of the transmitter. S/N is the signal-to-noise ratio (dBc, decibel carrier) generated at the carrier frequency, which is determined by the distance between the maximum output power and the normalized noise, to which the margin is added.

TABLE 1

The signal-to-noise ratio limits for the receive frequency band

| System | N 100 kHz | N 1 Hz | Margin | $P_{out}$ | S/N |
|--------|-----------|--------|--------|-----------|-----|
| GSM | −79 dBm | −129 dBm | 3 dB | 33 dBm | 165 dBc |
| PCN | −71 dBm | −121 dBm | 3 dB | 30 dBm | 154 dBc |
| PCS | −71 dBm | −121 dBm | 3 dB | 30 dBm | 154 dBc |

It is also possible to filter the noise by placing filters between the modulator of the transmit chain and the receiver.

Figure 1A:
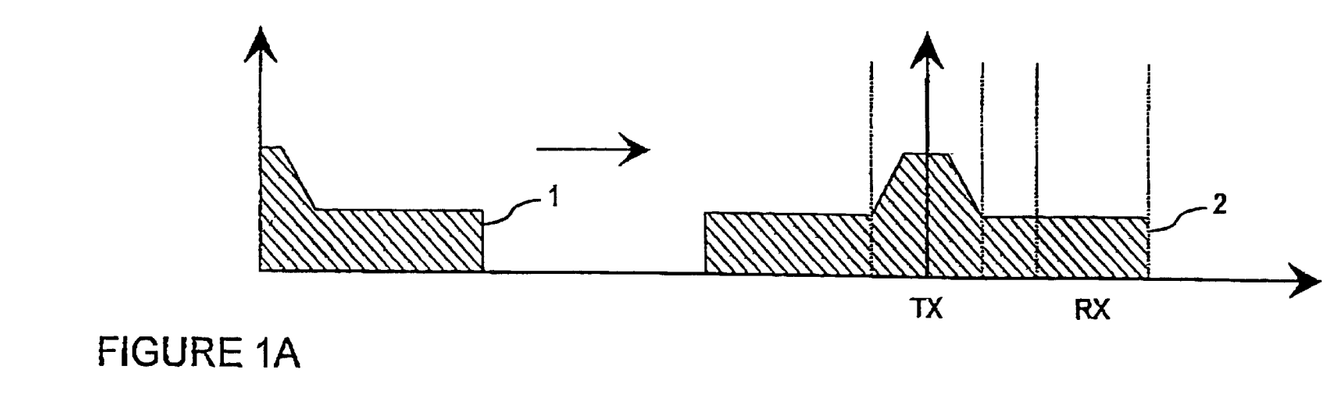
FIGS. 1A and 1B show the basic effect of a low-pass filter at the frequency ranges of a transmitter and a receiver.
Figure 1B:
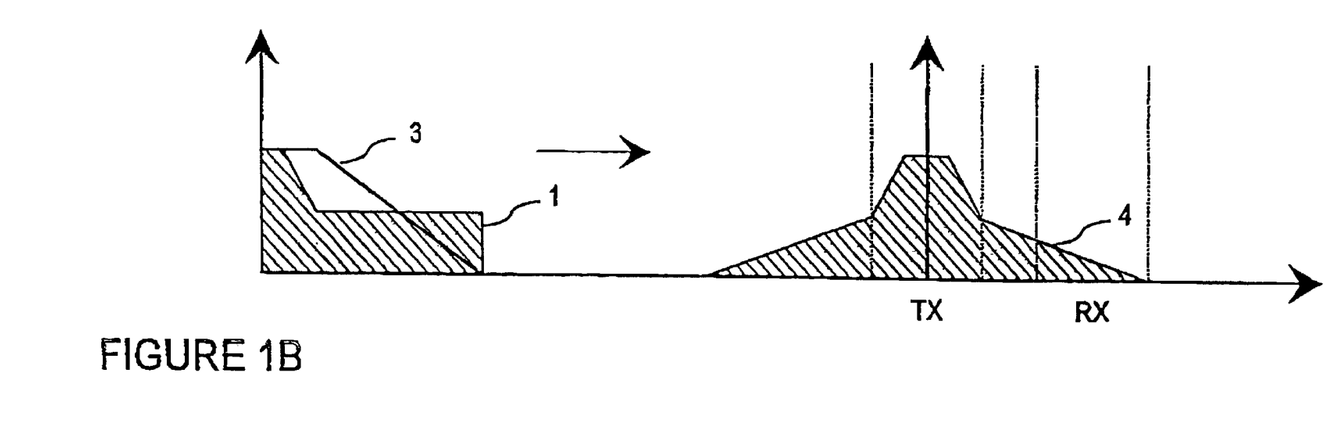

FIG. 1 shows the basic effect of a low-pass filter on radio signals. The original transmit signal 1 is mirrored into the frequency domain over the modulated center frequency. FIG. 1A shows that the final result 2 of the modulated but unfiltered transmit signal extends both into the intended transmit range TX and partly into the receive range RX. FIG. 1B shows that the final result 4 of the modulated transmit signal 1, which is filtered with the filter function 3, extends mainly into the intended transmit range TX, and only slightly into the receive range RX.

Previously there is also known a so called Gilbert cell, which is generally used in integrated multiplicator circuits of telecommunication systems, particularly in mobile stations. Multiplicator circuits are used for instance in integrated RF (Radio Frequency) and intermediate frequency sections, such as in the modulator, the mixer and the regulated amplifier.

A prior art multiplicator, such as a squaring multiplicator, is based on a mathematical formula where the difference of the squares of the sum and difference of two signals produces the product of the signals:

$$(x+y)^2 - (x-y)^2 = 4xy \quad (1)$$

where x is the first signal and y is the second signal.

The squaring is performed for instance by a MOS (Metal Oxide Semiconductor) transistor where the drain current is proportional to the square of the gate-source voltage. A multiplicator can also be realized with bipolar transistors. The collector current of a bipolar transistor $i_c$ is:

$$i_C = I_S e^{\frac{v_{BE}}{V_T}} \quad (2)$$

where the shown parameters are the bipolar transistor's saturation current $I_s$, the base-emitter voltage $V_{BE}$, and the thermal voltage $V_T$. The exponent function is here approximated by the first four terms of an infinite exponential Taylor series:

$$i_C = I_S \exp(x) \approx I_S \left\{ 1 + \frac{1}{1!}x + \frac{1}{2!}x^2 + \frac{1}{3!}x^3 \right\} \quad (3)$$

where $$x = \frac{v_{BE}}{V_T} \quad (4)$$

and the shown parameters are the bipolar transistor's base-emitter voltage $V_{BE}$ and the thermal voltage $V_T$.

Mixers use generally a double balanced structure where the outputs of four differently phased mixers are added in order to equalize the harmonic interference. The balancing is presented mathematically as follows:

$$(x+y)^2 + (-x-y)^2 - (x-y)^2 - (-x+y)^2 = 8xy \quad (5)$$

When the first four terms of the exponential Taylor series are substituted in the formula we still have the product of the input signals:

$$e^{x+y} + e^{-x-y} - e^{x-y} - e^{-x+y} = \frac{8}{2!}xy \qquad (6)$$

When we substitute the terms x and y for the terms representing the output signals the final mathematical formula can be written in the form:

$$e^{V_{BE}+x+y} + e^{V_{BE}-x-y} - e^{V_{BE}+x-y} - e^{V_{BE}-x+y} = \frac{8}{2!}xy \qquad (7)$$

Figure 2:
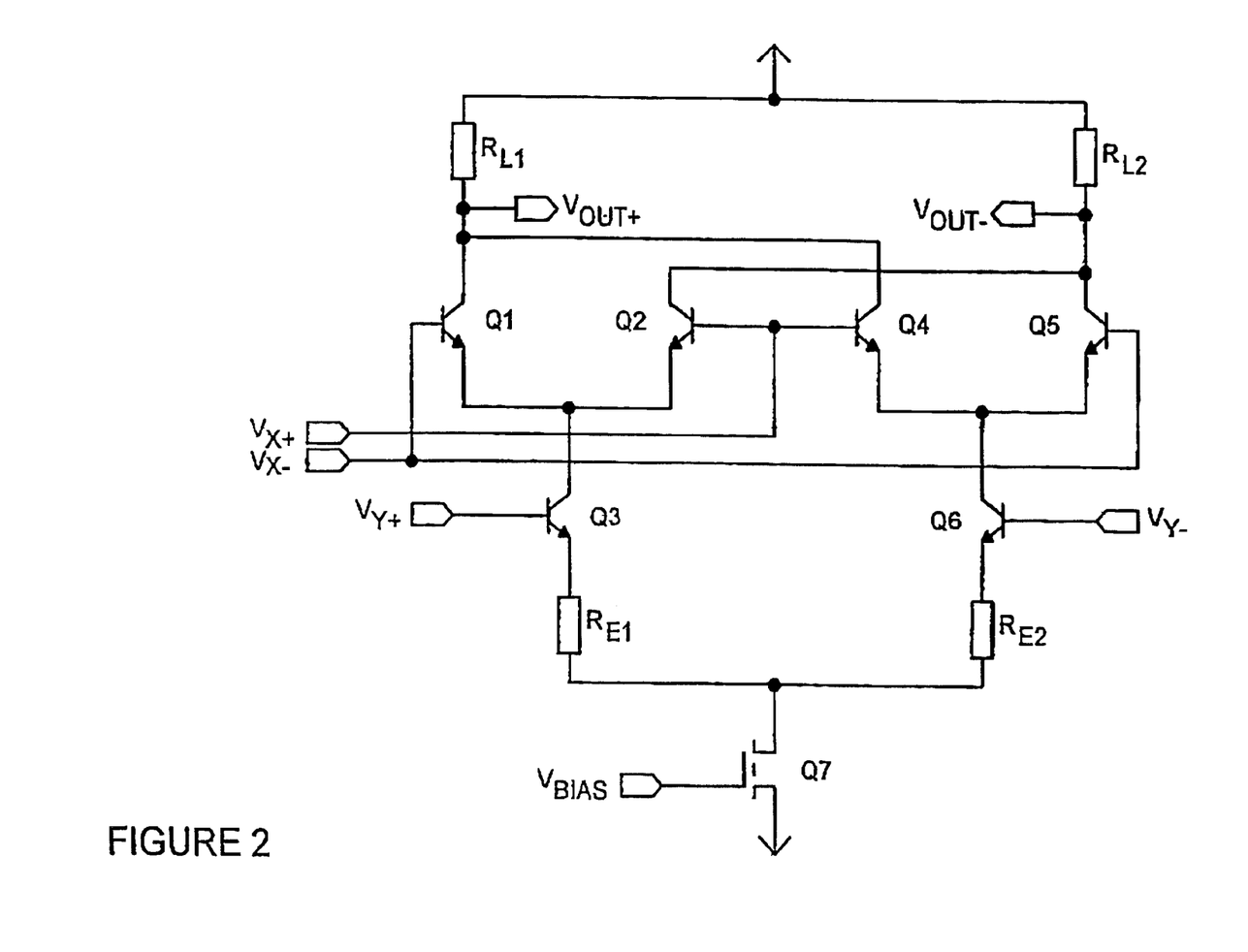
FIG. 2 shows a Gilbert cell known per se.

FIG. 2 shows a Gilbert cell known per se, which is used for instance to realize integrated RF and intermediate frequency sections, such as a regulated amplifier and a mixer. In a Gilbert cell two input voltages recur as one output voltage, in other words the voltage difference at the outputs is the product of the voltage differences at the inputs. The first voltage difference is connected to the terminals $V_{X+}$ and $V_{X-}$, from which the voltages are supplied to the bases of the transistors Q1 and Q2 and correspondingly to the bases of the transistors Q4 and Q5. The other voltage difference is connected to the terminals $V_{Y+}$ and $V_{Y-}$, from which the voltage is amplified by the transistors Q3 and Q6. The transistors Q3 and Q6 are connected via the resistors $R_{E1}$, and $R_{E2}$ to the field effect transistor (FET) Q7 which is controlled by the biasing voltage $V_{BIAS}$ and connected to the negative operating voltage. The transistors Q1 and Q5 amplify the positive voltage difference $V_{X+}$ and $V_{X-}$ which is connected to the outputs $V_{OUT+}$ and $V_{OUT-}$. The above mentioned circuit is connected to the positive operating voltage via the resistors $R_{L1}$ and $R_{L2}$. The transistors Q2 and Q4 amplify the negative voltage difference $V_{X+}$ and $V_{X-}$ which is connected to the outputs $V_{OUT+}$ and $V_{OUT-}$.

Figure 3:
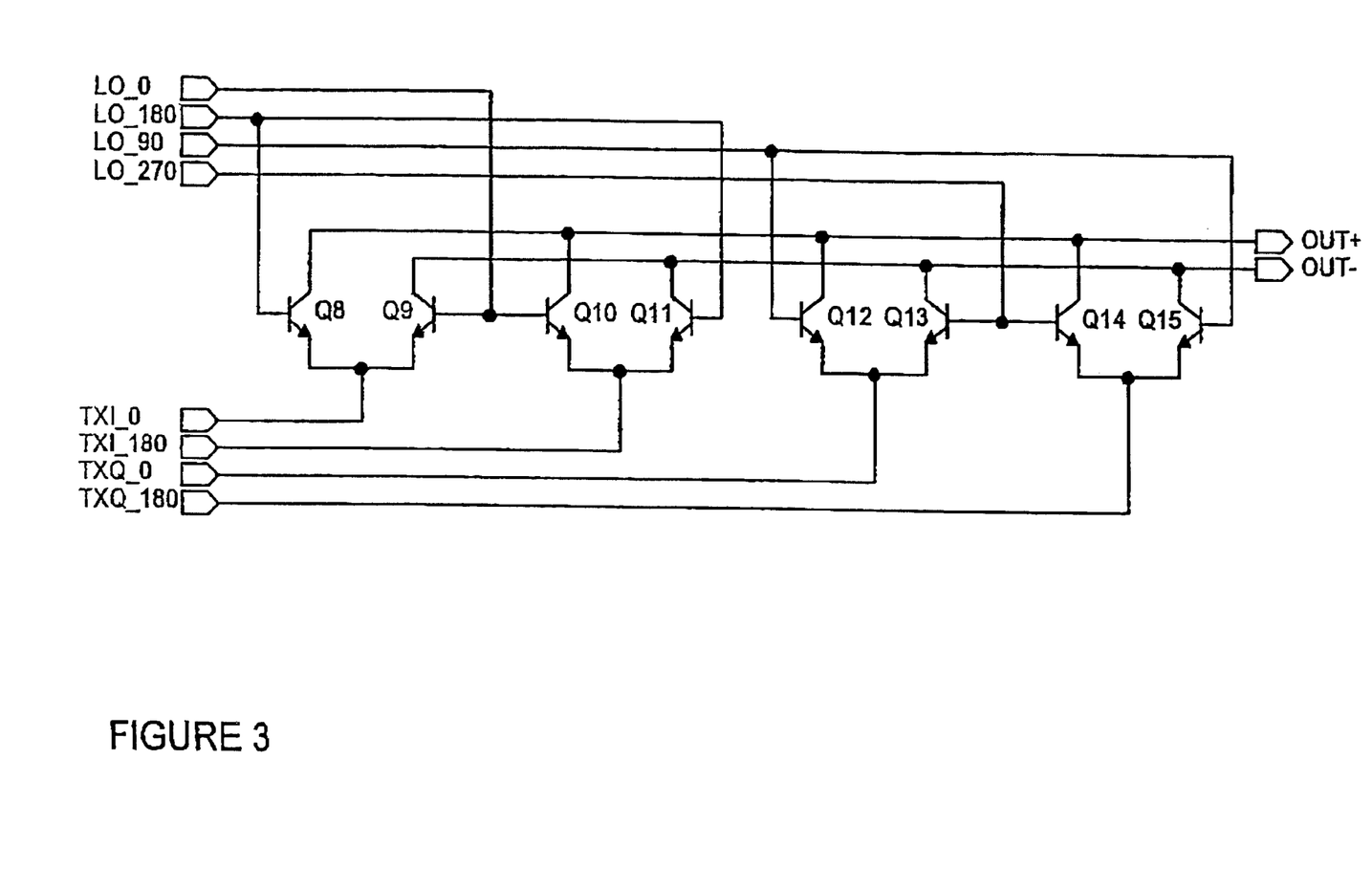
FIG. 3 shows the circuit arrangement of the switch transistors in a direct conversion modulator.

FIG. 3 shows the circuit arrangement of the switch transistors in a direct conversion modulator. The arrangement comprising the switch transistors is often called the switching arrangement or switching block of a modulator. Noise due to the local oscillator can be to a large extent eliminated by using balanced switching arrangement, for example pairs of transistors that have very similar characteristics.

FIG. 3 shows the switch transistors Q8, Q9, Q10, Q11, Q12, Q13, Q14 and Q15 of a direct conversion modulator. These transistors form four balanced transistor pairs. Four differently phased signals $LO_0$, $LO_{180}$, $LO_{90}$ and $LO_{270}$ from the local oscillator are supplied as control signals to the transistors. The transmit signals $TXI_0$ and $TXI_{180}$ with opposite phases and their complements $TXQ_0$ and $TXQ_{180}$ are supplied to the emitters of the transistors. The output signals OUT+ and OUT– are obtained at the transistor collectors.

A problem in known devices is that a mobile station operating at two or three frequency bands, i.e. a dual-band or triple-band mobile station, requires many filters, which occupy too much space in a mobile station. In practice the realization of a small-sized RF section in this way is impossible, and therefore there is a tendency to avoid filtering. However, when filtering is omitted the modulator must be of a particularly high quality.

A further problem in known devices is that they require separate filters between the modulator and the transmitter.

SUMMARY OF THE INVENTION

The object of the invention is to provide a modulator structure having good signal-to-noise properties. A further object of the invention is to provide a compact modulator structure that can be used in many frequency bands.

The object of the invention is achieved by minimizing in the modulator the noise accumulated to the modulated signal.

A modulator according to the invention is a modulator comprising a switching arrangement and a driver arrangement coupled to the switching arrangement, said driver arrangement comprising driver components and among the driver components at least one low-pass filter arrangement.

A mobile station according to the invention comprises a transceiver whose modulator arrangement comprises a switching arrangement and a driver arrangement coupled to the switching arrangement, said driver arrangement comprising driver components and among the driver components at least one low-pass filter arrangement.

The noise that a modulator causes to the receiver frequency range comprises the noise of the switch transistors in the modulator, the noise of the local oscillator, and the noise of the signal carrying the information to be transmitted. In a balanced modulator structure the noise due to the switch transistors is dampened so that it is not the dominating component in noise. Current state-of-the-art bipolar transistors have nowadays usually low enough noise level.

The noise in the information signal can be a dominating factor, especially in direct conversion modulators. Therefore it is advantageous to filter the possible noise component away from the signal carrying the information to be transmitted. In a modulator according to the invention, this filtering is carried out in the modulator.

A modulator here refers to an arrangement where information signal, i.e. the signal carrying the data to be transmitted, and the signal having the carrier frequency interact. The information signal is usually coupled to the driver arrangement of a modulator and the signal from the local oscillator to the switching arrangement. The driver and switching arrangements are coupled to each other in such a way that the information signal modifies the carrier wave from the local oscillator. In a modulator according to the invention, a low-pass filter for attenuating high frequency interference is integrated to the driver arrangement of the modulator.

In one embodiment the modulator is of the direct conversion type.

In one embodiment the low-pass filter is located in the current mirror of the multiplicator circuit of the modulator.

In one embodiment the low-pass filter is located between the transistors of the transistor pair which mirrors the current in the current mirror, whereby the low-pass filter filters the signal path between the transistor supplying the control and the transistor generating the mirrored current.

In one embodiment the low-pass filter is formed by an RC low-pass arrangement where the resistor is connected in series with the signal path and the capacitor is connected in parallel regarding the signal's propagation direction behind the resistor, to the common potential of the transistor pair.

In one embodiment the common potential of the transistor pair is connected to the negative potential of the operating voltage.

The invention relates also to a mobile station having a low-pass filter in the transmitter chain for attenuating high frequency interference. According to the invention the low-pass filter is located in the direct conversion modulator of the transmitter.

An advantage of the invention is that the required low-pass filter can be integrated into the modulator. The low-pass filter dampens the noise due to the information signal before the information signal is mixed with the carrier wave. Therefore the low-pass filter integrated to the modulator can replace the filters that are currently placed after the power amplification of the modulated signal and that are chosen separately for each frequency band.

A further advantage of the invention is that with a low-pass filter according to the invention the transmission chain has a better signal-to-noise ratio than previous solutions.

DETAILED DESCRIPTION OF THE INVENTION

Figure 4:
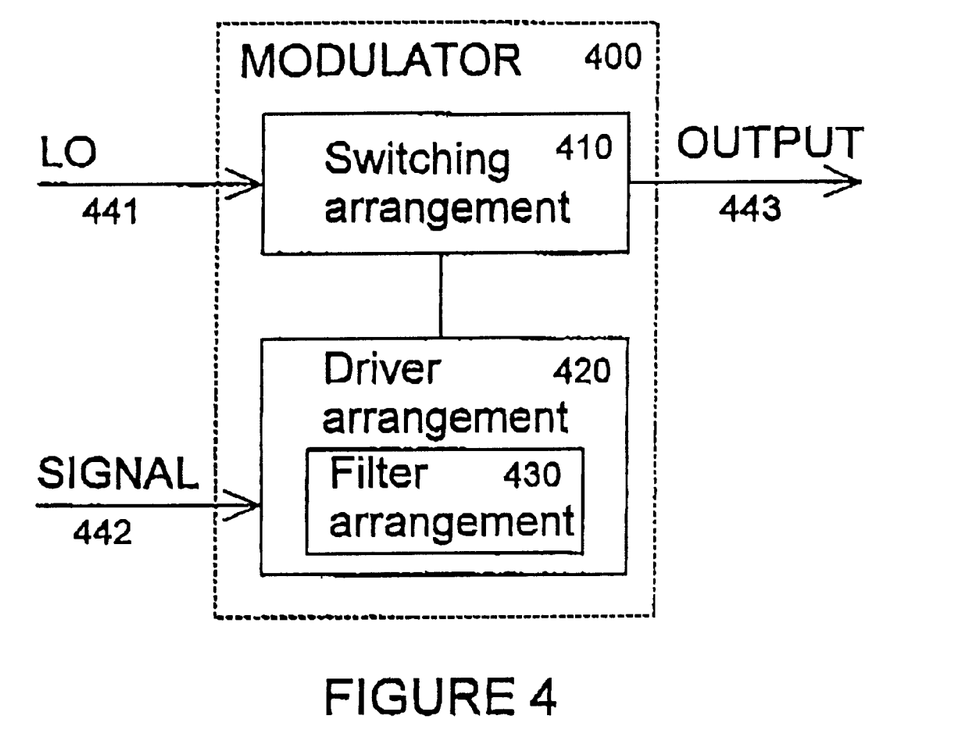
FIG. 4 shows a schematic drawing of a modulator according to the invention.

FIG. 4 shows a schematic drawing of a modulator 400 according to the innovation. The modulator 400 comprises a switching arrangement 410 to which the local oscillator is coupled (arrow 441 in FIG. 4). It further comprises a driver arrangement 420 to which the information signal is couples (arrow 442 in FIG. 4). The modulated signal, i.e. the carrier wave that has been modified according to the information signal, is derived from the modulator (arrow 443).

In FIG. 4 the signal from the local oscillator, the information signal and the modulate signal are presented with single arrows. In actual implementation, for example, the signal from the local oscillator is usually coupled to the modulator in different phases. Similarly, the information signal may be coupled to the modulator using more than one input point, and the modulated signal may be obtained from the modulator via many output points. The driver and switching arrangements may also be coupled to each other in many points. The line in FIG. 4 in between the arrangements 410 and 420 only schematically indicates that the blocks are coupled to each other. It does not implicate that they should be coupled to each other in only one point.

The driver arrangement 420 comprises certain driver components and, in addition to these components, in a modulator 400 according to the invention, it comprises a filter arrangement 430. This low-pass filter arrangement is used to eliminate the noise in the information signal to a large extent. Preferably the filter arrangement is such that is it possible to construct it as a part of the integrated circuit.

Figure 5A:
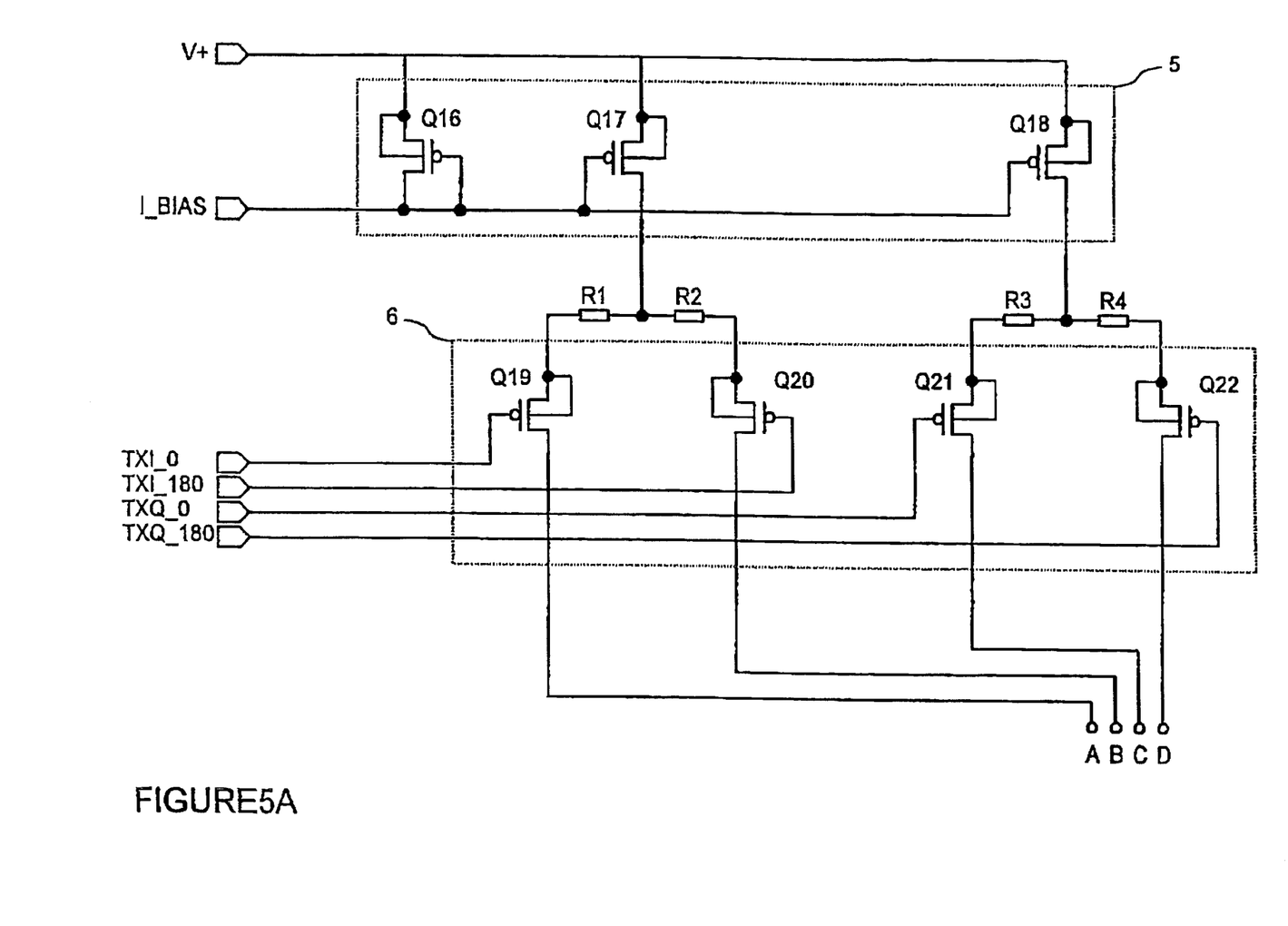
FIGS. 5A, B show the essential parts regarding the invention in a circuit diagram of a direct conversion modulator according to the invention.
Figure 5B:
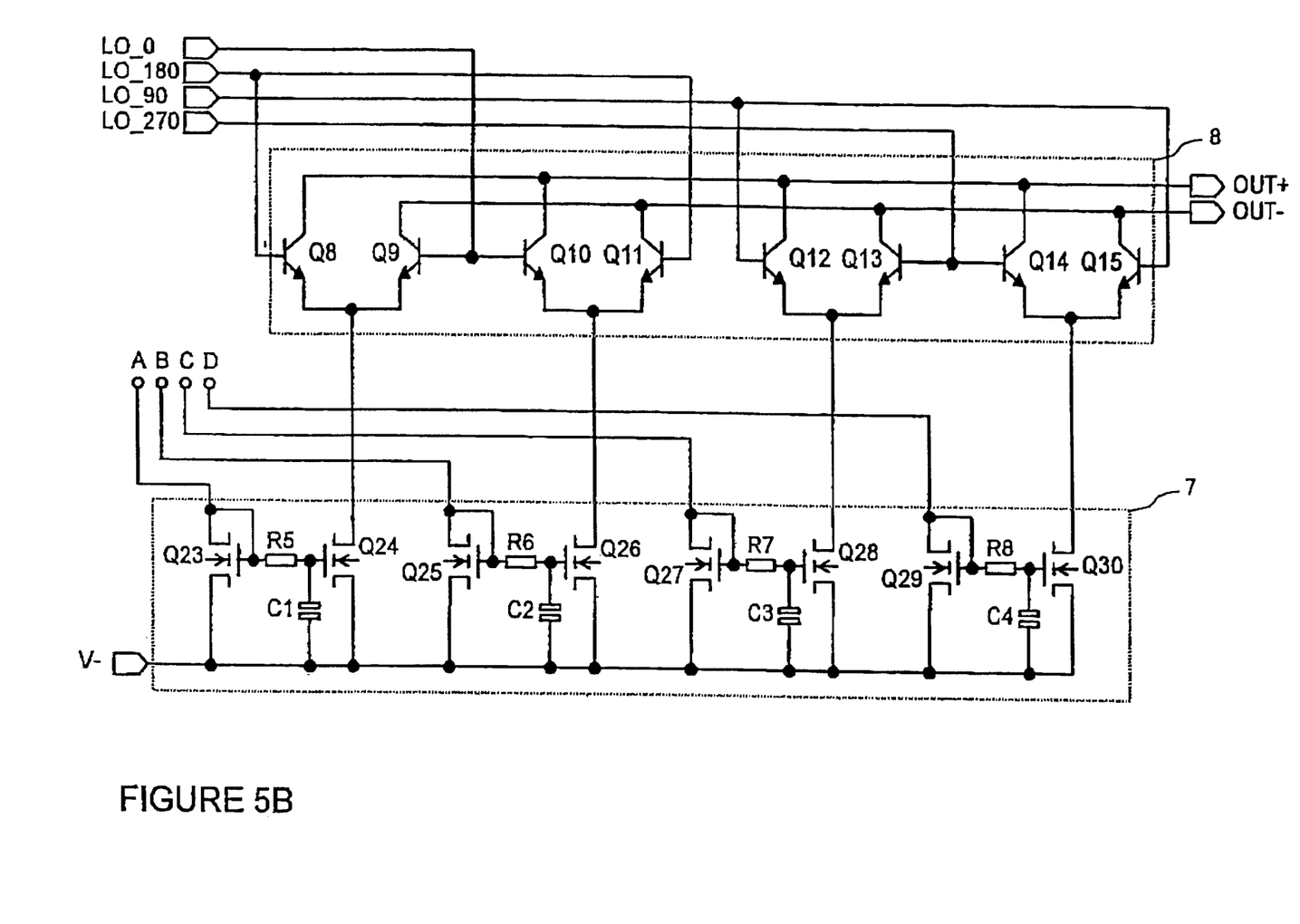

FIG. 5 shows on two pages, in the FIGS. 5A and 5B, the essential parts regarding the invention in a circuit diagram of a direct conversion modulator according to the invention. In figure 5A we see how the transmit signals $TXI_0$ and $TXI_{180}$ with opposite phases and their complements $TXQ_0$ and $TXQ_{180}$ through the biasing current $I_{BIAS}$ control the connection between the positive operating voltage potential V+ and the current mirrors 7 of FIG. 5B. The current $I_{BIAS}$ controls the currents with the aid of the current mirror 5 comprising the arrangement of the transistors Q16, Q17 and Q18. The currents are further supplied to the current mirrors 7 through the resistors R1, R2, R3 and R4, and through the control arrangement 6 comprising the transistors Q19, Q20, Q21 and Q22 which are controlled by transmit signals. Thus the transmit signals $TXI_0$, $TXI_{180}$, $TXQ_0$, $TXQ_{180}$ and the biasing current $I_{BIAS}$ control the modulator with the aid of the current mirrors 7. The transistors in the current mirrors 7 in FIG. 5B present an example of driver components in a driver arrangement 420 in FIG. 4.

Due to the low operating voltage and the required high output power we can see in the modulator an arrangement having only two transistors in series between the output OUT+, OUT− and the negative operating voltage potential V−. These two transistors are the switch transistors 8 and the transistors of the current mirror 7.

The RC low-pass filters (RC, resistor-capacitor) according to the invention which filter the high frequency noise of the transmit signals $TXI_0$, $TXI_{180}$, $TXQ_0$, $TXQ_{180}$ and the biasing current $I_{BIAS}$ are seen in the current mirrors 7 formed by the resistors R5, R6, R7, R8 and the capacitors C1, C2, C3, C4 between the transistors Q23, Q24, Q25, Q26, Q27, Q28, Q29, Q30. The capacitors C1, C2, C3, C4 are connected to the negative potential V− of the operating voltage, or to any potential having a sufficiently low noise. Regarding the signal passage the filter is located as late as possible to enable a high signal-to-noise ratio. Otherwise the unfiltered noise would be mixed to the reception frequency range and the signal-to-noise ratio would decrease.

Figure 6:
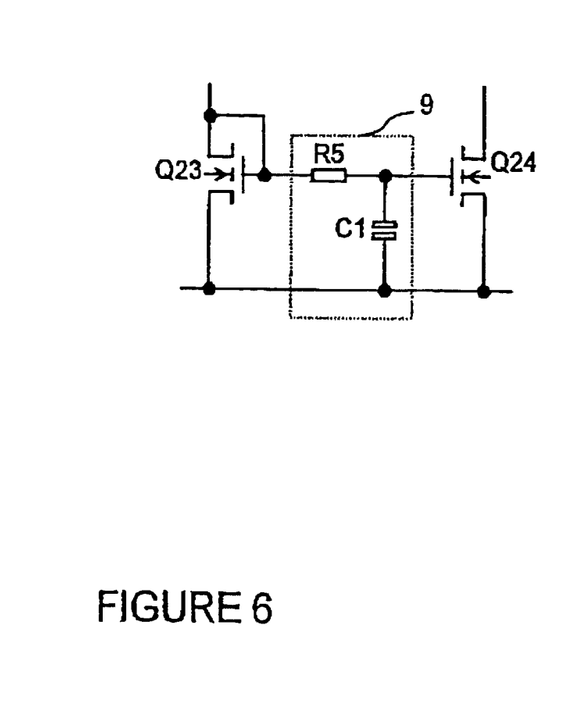
FIG. 6 shows the current mirror of a direct conversion modulator according to the invention.

FIG. 6 shows a more unconstrained arrangement of one current mirror located in the current mirrors 7 of FIG. 4B. On the signal path behind the controlling transistor Q23 there is an RC filter 9 comprising a series resistance R5 and a parallel capacitance C1. The signal is further supplied to the transistor Q24 generating the mirrored current. In FIG. 6 the resistor R5 and the condensator C1 (and how they are connected to the current mirror) present an example of the filter arrangement 430 in FIG. 4.

Figure 7:
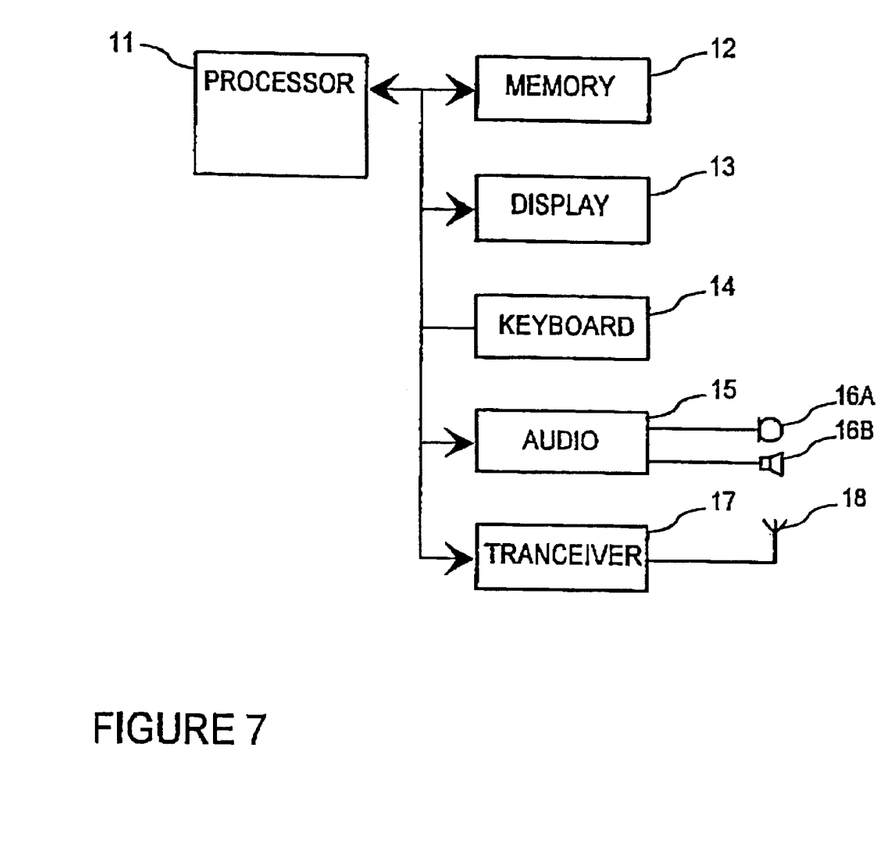
FIG. 7 shows in a block diagram some essential parts of a mobile station according to the invention.

FIG. 7 shows some parts of a mobile station utilizing the invention. The mobile station comprises according to prior art a processor 11, a memory 12, a display 13, a keyboard 14, and an audio block 15 with a microphone 16A and a speaker 1613. The modulator according to the invention, which contains a low-pass filter, is located in the transceiver block 17, which is connected to the antenna 18.

The invention is not limited to concern only the presented embodiment examples, but many modifications are possible within the inventive idea defined by the claims. A mobile station according to the invention may be a mobile station related to any cellular system.

What is claimed is:

1. A modulator comprising a switching arrangement and a driver arrangement coupled to the switching arrangement, said driver arrangement comprising current mirrors and said current mirrors comprising a pair of transistors with at least one low-pass filter arrangement located between the pair of transistors to filter the signal path between the pair of transistors.

2. A modulator according to claim 1 wherein said low-pass filter arrangement comprises a resistor element and a condensator element.

3. A modulator according to claim 2 wherein said pair of transistors have control terminals and other terminals and wherein the resistor element couples the control terminals of the pair of transistors of a current mirror and the condensator element couples said control terminals to other terminals of said transistor elements.

4. A modulator according to claim 3 wherein said pair of transistors comprise field effect transistors and wherein the resistor element couples the gates of the field effect transistors and the condensator element couples the gates to the drains of said field effect transistors.

5. A modulator according to claim 1 wherein said current mirrors have control sides and further comprising inputs communicating data to be transmitted, and wherein the control sides of the current mirrors are coupled to the inputs via transistor elements.

6. A modulator according to claim 1, comprising a direct conversion modulator.

7. A mobile station comprising a transceiver whose modulator arrangement comprises a switching arrangement and a driver arrangement coupled to the switching arrangement, said driver arrangement comprising current mirrors and said current mirrors comprising a pair of transistors with at least one low-pass filter arrangement located between the pair of transistors to filter the signal path between the pair of transistors.

8. A mobile station according to claim 7 wherein said low-pass filter arrangement comprises a resistor element and a condensator element.

9. A mobile station according to claim 8 wherein said pair of transistors have control terminals and other terminals and wherein the resistor element couples the control terminals of the pair of transistors of a current mirror and the condensator element couples said control terminals to other terminals of said transistor elements.

10. A mobile station according to claim 9 wherein said pair of transistors comprise field effect transistors and wherein the resistor element couples the gates of the field effect transistors and the condensator element couples the gates to the drains of said field effect transistors.

11. A mobile station according to claim 7 wherein said current mirrors have control sides and further comprising inputs communicating data to be transmitted, and wherein the control sides of the current mirrors are coupled to the inputs via transistor elements.

12. A mobile station according to claim 7, wherein said modulator arrangement comprises a direct conversion modulator.

* * * * *